United States Patent
Haensel et al.

(10) Patent No.: US 7,483,456 B2
(45) Date of Patent: Jan. 27, 2009

(54) DIODE LASER MODULE AND METHOD FOR THE PRODUCTION THEREOF

(75) Inventors: Hartmut G. Haensel, Jena (DE); Petra Hennig, Moersdorf (DE); Dirk Lorenzen, Jena (DE); Guido Bonati, Weimar (DE)

(73) Assignee: JENOPTIK Laserdiode GmbH, Jena (DE)

( * ) Notice: Subject to any disclaimer, the term of this patent is extended or adjusted under 35 U.S.C. 154(b) by 302 days.

(21) Appl. No.: 11/286,251

(22) Filed: Nov. 23, 2005

(65) Prior Publication Data

US 2006/0109882 A1   May 25, 2006

(30) Foreign Application Priority Data

Nov. 25, 2004   (DE)   ........................ 10 2004 057 454

(51) Int. Cl.
*H01S 3/04* (2006.01)
(52) U.S. Cl. .......................................... 372/34; 372/36
(58) Field of Classification Search .................. 372/34, 372/36
See application file for complete search history.

(56) References Cited

U.S. PATENT DOCUMENTS

| 6,053,640 | A  | * | 4/2000  | Miyokawa et al. ............ 385/88 |
| 6,072,815 | A  | * | 6/2000  | Peterson ...................... 372/36 |
| 6,270,261 | B1 | * | 8/2001  | Kawano ....................... 385/88 |
| 2002/0027231 | A1 | * | 3/2002  | Okada et al. ................. 257/118 |
| 2002/0093738 | A1 | * | 7/2002  | Kimura et al. ............... 359/497 |
| 2003/0108304 | A1 |   | 6/2003  | Ziari et al. |
| 2004/0202212 | A1 | * | 10/2004 | Yamauchi .................... 372/36 |
| 2004/0258124 | A1 | * | 12/2004 | Lissotschenko ............ 372/75 |

FOREIGN PATENT DOCUMENTS

| DE | 196 52 515 | 6/1997 |
| DE | 44 31 285  | 9/1997 |
| DE | 199 44 042 | 9/1999 |
| DE | 198 21 544 | 12/1999 |
| DE | 697 04 000 | 5/2001 |
| DE | 102 04 799 | 9/2003 |
| EP | 0 987 801  | 7/1999 |

* cited by examiner

*Primary Examiner*—Minsun Harvey
*Assistant Examiner*—Phillip Nguyen
(74) *Attorney, Agent, or Firm*—Reed Smith LLP

(57) ABSTRACT

In a diode laser module and a method for the production thereof, there is a need to fix the optical elements required for collimating, beam shaping and/or beam rearrangement of the radiation of a laser diode element with high reproducibility and long-term stability in an optically aligned manner, wherein the optically aligned state is produced by a successive adjustment of the optical elements in the beam of the switched-on laser diode element. It must be ensured that the fixing can be carried out in a process that is at least partially automated. At least one intermediate carrier is arranged on a heat-dissipating carrier serving to cool the laser diode element. The heat conductivity of the intermediate carrier is less than that of the heat-dissipating carrier, and the alignment of the optical components and fixation by sequential soldering is carried out on the surface of the intermediate carrier.

9 Claims, 2 Drawing Sheets

DIODE LASER MODULE AND METHOD FOR THE PRODUCTION THEREOF

CROSS-REFERENCE TO RELATED APPLICATIONS

This application claims priority of German Application No. 10 2004 057 454.5, filed Nov. 25, 2004, the complete disclosure of which is hereby incorporated by reference.

BACKGROUND OF THE INVENTION a) Field of the Invention

The invention is directed to a diode laser module which contains at least one bonded laser diode element and optical components on a common heat-dissipating carrier.

b) Description of the Related Art

The invention is further directed to a method for producing a diode laser module which contains at least one bonded laser diode element and optical components on a common heat-dissipating carrier, wherein the optical components are aligned and subsequently fixed in the operating state of the laser diode element.

Laser diode elements comprise individual laser diodes and laser diode bars. Individual laser diodes have only one individual laser diode emitter which is defined by an optically contiguous active zone. Laser diode bars are monolithic semiconductor laser arrangements of at least two laser diode emitters that are optically operational substantially independent from one another. The lateral extension of laser diode bars depends upon the width, spacing and quantity of emitters. Typical widths range from 1 mm to 15 mm.

As is well known, laser diode elements present difficulties in practical application because of their poor beam propagation characteristics.

Therefore, it is almost always necessary to optically transform the beam emitted by the laser diode element into a suitable form making use of the high output and favorable efficiency so that they are usable for the intended purpose.

The optics used for collimating, beam shaping and/or beam rearrangement were previously usually aligned by successive adjustment in the beam of the switched-on laser diode element and fixed successively in the aligned state.

Fixing by means of gluing has the disadvantage that outgassing can have a negative influence on the optical layers. Further, gluing technology can be automated only within limits because of long curing times. Further, shrinkage occurring during the hardening of the glue leads to unwanted changes in position of the optics so that the optical characteristics do not correspond to those of the optimal position.

While these disadvantages hinder reliable assembly with reproducible quality, the unfavorable aging behavior of the adhesives, which results in embrittlement, limits the life of the glue connections. This rules out, or at least severely limits, desirable long-term applications.

OBJECT AND SUMMARY OF THE INVENTION

Therefore, there is a need to fix the optical elements required for collimating, beam shaping and/or beam rearrangement of the radiation of a laser diode element with high reproducibility and long-term stability in an optically aligned manner, wherein the optically aligned state is produced by a successive adjustment of the optical elements in the beam of the switched-on laser diode element. It must be ensured that the fixing can be carried out in a process that is at least partially automated.

This need is met in a diode laser module of the type mentioned in the beginning in that at least one intermediate carrier is arranged on the heat-dissipating carrier, the heat conductivity of the at least one intermediate carrier being less than that of the heat-dissipating carrier, and at least one optical component is fastened to the surface of the intermediate carrier by at least one solder connection point.

An intermediate carrier constructed as an optical bank on which the solder connection points are arranged at a distance from one another can preferably be provided.

In another construction, the intermediate carrier has raised areas with surfaces which lie in a common plane and on which the solder connection points are located. In particular, the intermediate carrier can be constructed as a toothed rack.

When the optical components are provided with optics mounts, it is advantageous when the intermediate carrier is made of optically transparent material so that, in order to solder, a laser beam can be directed through the transparent material to a solder connection point for connecting the intermediate carrier to the optical components.

It is particularly advantageous when the intermediate carrier is constructed at least partially as a beam-reversing truncated-cone prism on whose base surface the solder connection points are located and which is connected to the heat-dissipating carrier by its surface extending parallel to the base surface. A suitable material for the intermediate carrier which is transparent to radiation is glass which achieves a sufficient thermal insulation from the heat-dissipating carrier and between the optical components.

When the optical components are at least partially transparent to radiation, the intermediate carrier can comprise material that is not transparent to radiation.

Further, the above-stated object is met, according to the invention, by a method for producing a diode laser module of the type mentioned in the beginning in that at least one intermediate carrier is arranged on the heat-dissipating carrier, the heat conductivity of the at least one intermediate carrier falling below that of the heat-dissipating carrier, and the alignment of the optical components and the fixing thereof by sequential soldering is carried out on the surface of the intermediate carrier.

In particular, fixation by means of locally defined soldering is carried out by means of at least one selective sold joint on at least one intermediate carrier, wherein a surface region determined by the local delimitation can also be more than 90% smaller than the surface region of the joint surfaces.

In an advantageous manner, the soldering process can be automated particularly when the soldering is preferably carried out by supplying energy by means of a laser beam (laser beam soldering). Negative influence on optical layers due to outgassing occurring when adhesives are used can be prevented. Long-term stable connections result after fixation.

In order to manage longitudinal tolerances in the optical components, these can be compensated by different solder volumes, e.g., by different solder preform thicknesses.

The heat insulation function of the intermediate carrier which is determined by material and, optionally, by shape ensures a local sequential soldering of the optical components or mounted optical components without the solder connections being thermally loaded during subsequent soldering such that they melt again. Further, by means of a preferred use of low-melting solders—particularly soft solders—the solder temperature and the thermal and thermomechanical loading of the articles to be joined can be kept low.

The invention will be described more fully in the following with reference to the schematic drawings.

DESCRIPTION OF THE PREFERRED EMBODIMENTS

Intermediate carriers 4 are arranged on a heat-dissipating carrier 1, e.g., of copper, for receiving optical components 2 (e.g., lenses) for beam shaping and/or beam rearrangement of the radiation emitted by a laser diode element 3. The heat conductivity of the intermediate carriers 4 is less than that of the heat-dissipating carrier 1, so that the intermediate carriers 4 carry out a heat insulating function.

Figure 1:
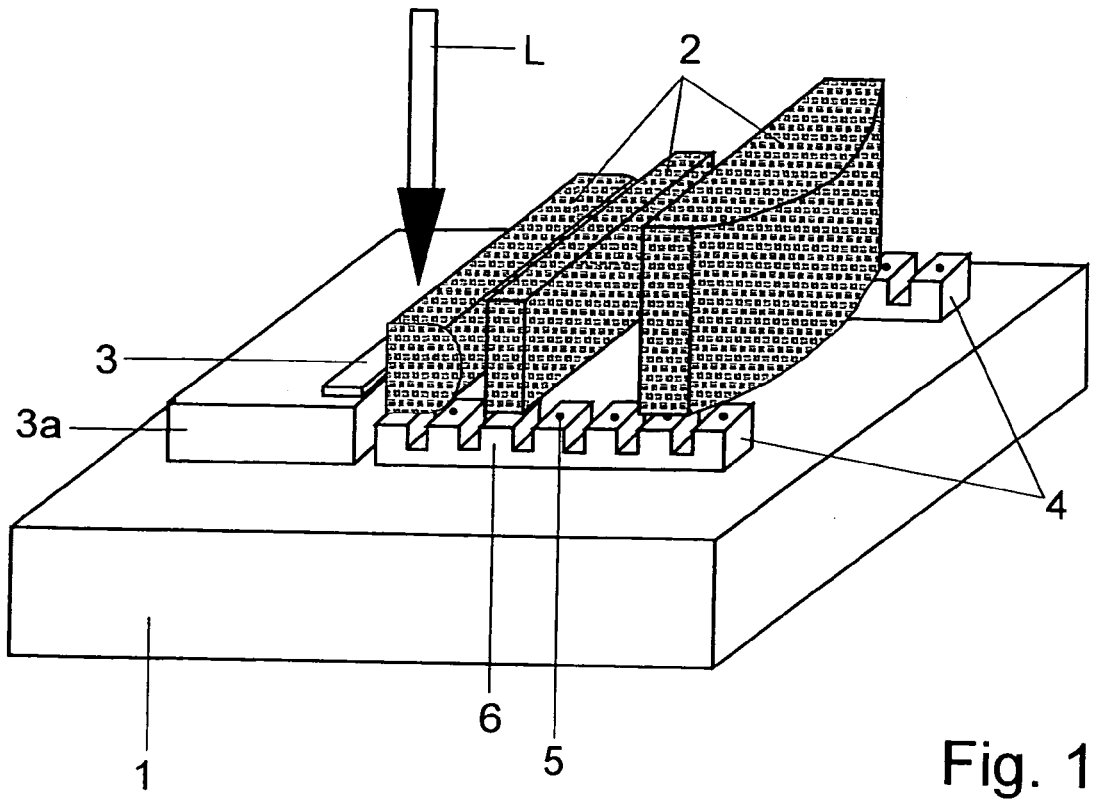
FIG. 1 shows a first embodiment for fixing optical components on intermediate carriers which are constructed as toothed racks.
Figure 2:
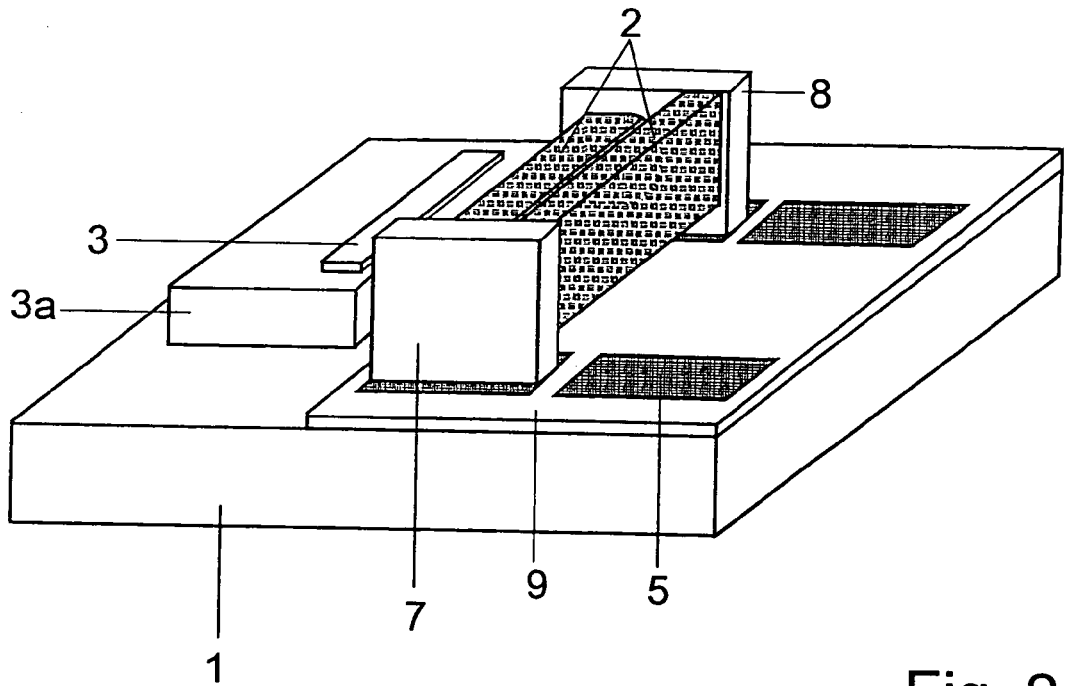
FIG. 2 shows the fixing of mounted optical components.

For the sake of clarity and without limiting the essential idea of the invention, the bonded laser diode elements 3 in FIG. 1 and FIG. 2 are shown with only one individual contact element 3a which is arranged between the laser diode element 3, which is preferably constructed as laser diode bars, and the carrier 1.

In a first construction, the intermediate carriers 4, which are constructed in pairs as toothed racks, are preferably made of electrically insulating material, e.g., glass or ceramics.

On one side, by which a connection to an intermediate carrier 4 is to be made, the optical components 2 have metallization layer systems, e.g., in the sequence: titanium, platinum, gold, which, depending on the size of the optical components 2, are suitable for producing a solder connection to at least one solder connection point 5 formed, e.g., by solder paths. The solder connection points 5 are arranged at a distance from one another on the intermediate carriers 4, in this case on the teeth 6 of the toothed racks.

In this construction, the solder connections are preferably produced by means of laser radiation L which is introduced in a locally defined manner through the optical component 2 that is transparent to radiation. Because of a low heat conductivity and the structuring of the intermediate carriers 4 made from glass or ceramics, different optical components 2 can be fixed successively by sequential soldering in a locally defined manner without melting the preceding soldering because the solder connection points 5 are thermally insulated relative to one another and relative to the carrier 1 required for cooling the laser diode element 3.

In another construction, the optical components 2 are already connected to one another at least by pairs by means of lateral bridge elements 7, 8. Preferably laser-initiated solder connections with high melting solder, e.g., gold-tin, are suitable for connecting the bridge elements 7, 8 to the optical components 2. The optical components 2 which are connected with one another are connected to at least one solder connection point 5 by the bridge elements 7, 8, a plurality of which solder connection points 5 are arranged at a distance from one another on a layer-shaped intermediate carrier 9 which is arranged on the heat-dissipating carrier 1.

Figure 3:
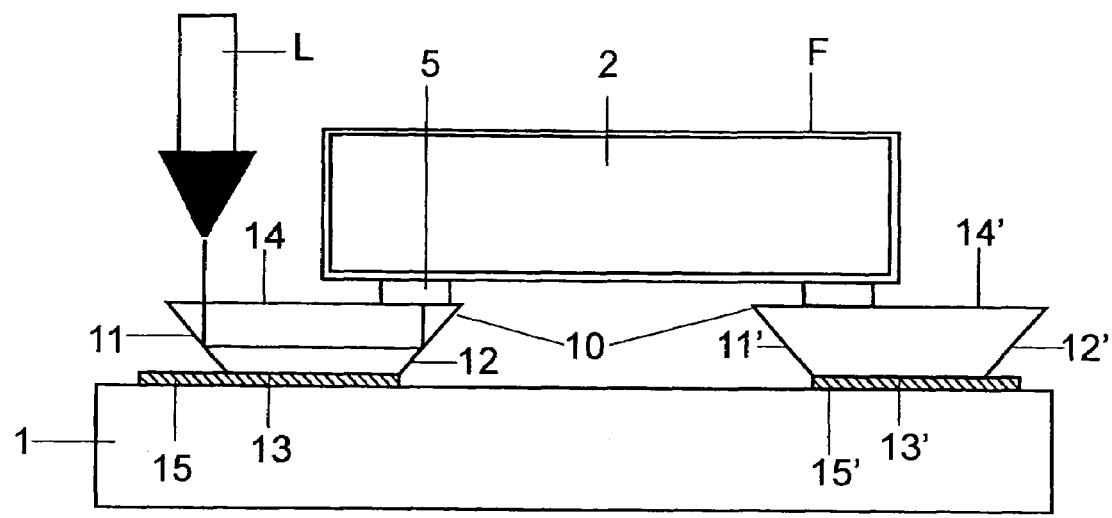
FIG. 3 shows an intermediate carrier constructed as an optical deflecting element.

In a third construction, according to FIG. 3, intermediate carriers 10 of optically transparent material are provided to ensure that locally defined laser radiation L is supplied to at least one solder connection point 5 when the optical components 2 are enclosed by an optics mount F such that they cannot pass radiation in direction of the solder connection point 5.

The intermediate carriers 10 that are constructed as beam-reversing truncated-cone prisms have two reflecting deflecting surfaces 11, 11' and 12, 12' that are inclined by 90° relative to one another and two surfaces 13, 13' and 14, 14' which are parallel to one another, a first surface 13, 13' being connected by a connection layer 15, 15' to the heat-dissipating carrier 1. Solder connection points 5 arranged at a distance from one another are located on the second surface 14, 14', namely the base surface of the truncated-cone prisms, for fastening the optical components 2 aligned in the laser beam of the laser diode element 3. A laser beam L directed to the base surface is guided to these optical components 2 by the reflecting deflecting surfaces 11, 11' and 12, 12' through a 180-degree deflection.

Figure 4:
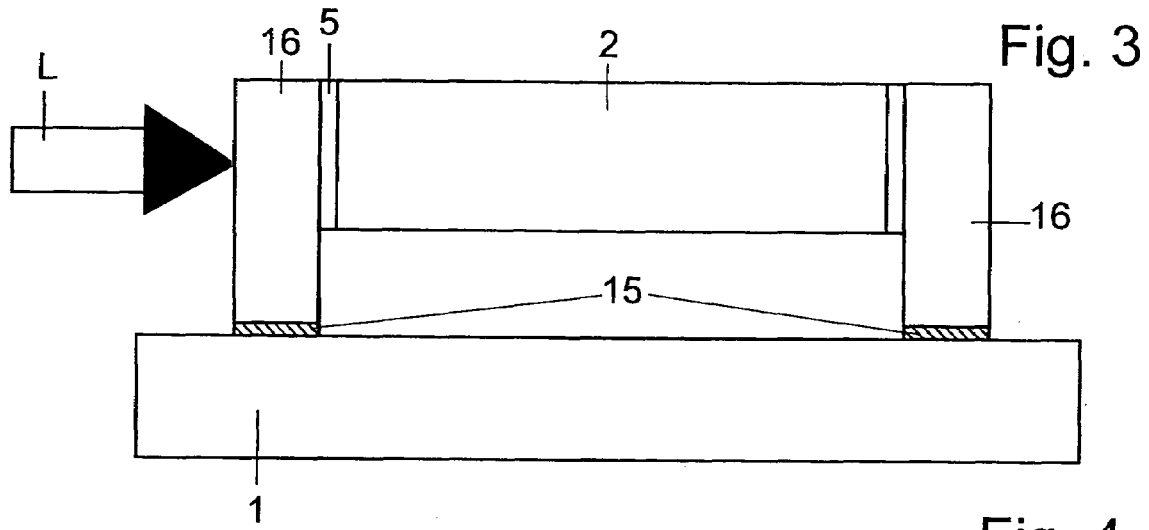
FIG. 4 shows intermediate carriers arranged lateral to the optical components.

According to FIG. 4, intermediate carriers 16 which are positioned at the sides of the optical components 2 and through which the laser beam L is directed to the solder connection point 5 directly without deflection can also be provided.

Figure 5:
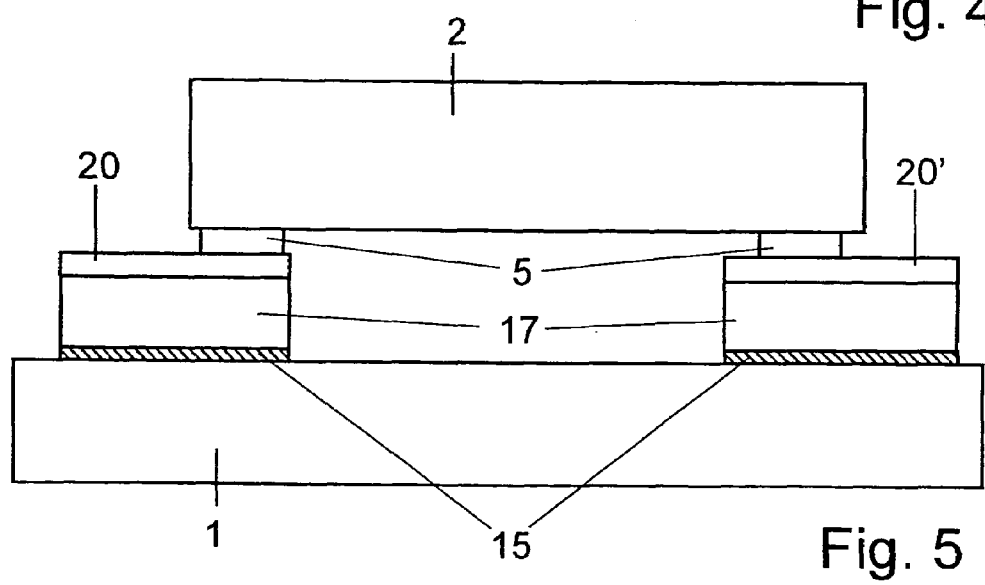
FIG. 5 shows intermediate carriers constructed as resistance heating elements.

Finally, according to FIG. 5, a diode laser module is provided in which heat-transmitting layer areas 20, 20' lying on thermally insulating intermediate carriers 17 serve as an intermediate element for providing heat to the location of the solder connection point 5. The layer areas 20, 20' can be heated by applying heat or act as resistance heating elements by supplying electrical energy.

While the foregoing description and drawings represent the present invention, it will be obvious to those skilled in the art that various changes may be made therein without departing from the true spirit and scope of the present invention.

What is claimed is:

1. A diode laser module comprising:
   a common heat-dissipating carrier;
   at least one bonded laser diode element being arranged on said common heat-dissipating carrier;
   at least one intermediate carrier being arranged on the heat-dissipating carrier, the heat conductivity of the intermediate carrier being less than that of the heat-dissipating carrier; and
   at least one optical component being fastened to the surface of the intermediate carrier by at least one solder connection point
   wherein the intermediate carrier is made of optically transparent material and is constructed at least partially as a beam-reversing truncated-cone prism on whose base surface the solder connection points are located and which is connected to the heat-dissipating carrier by its surface extending parallel to the base surface.

2. The diode laser module according to claim 1, wherein the optical components are provided with optics mounts.

3. The diode laser module according to claim 1, wherein the intermediate carrier is constructed as an optical bank on which the solder connection points are arranged at a distance from one another.

4. The diode laser module according to claim 3, wherein the intermediate carrier has raised areas with surfaces which lie in a common plane and on which the solder connection points are located.

5. The diode laser module according to claim 1, wherein at least one toothed rack is provided as intermediate carrier.

6. The diode laser module according to claim 1, wherein the intermediate carrier is made of glass.

7. A method for producing a diode laser module which contains at least one bonded laser diode element and optical components on a common heat-dissipating carrier, wherein the optical components are aligned and subsequently fixed in the operating state of the laser diode element, comprising the steps of:

arranging at least one intermediate carrier on the heat-dissipating carrier, wherein the heat conductivity of the intermediate carrier is less than that of the heat-dissipating carrier, the intermediate carrier is made of optically transparent material, and the intermediate carrier is constructed at least partially as a beam-reversing truncated prism on whose base surface the solder joints are located and which is connected to the heat-dissipating carrier by its surface extending parallel to the base surface; and carrying out the alignment of the optical components and the fixation by sequential soldering on the surface of the intermediate carrier.

8. The method according to claim 7, wherein the fixation by locally defined soldering is carried out by least one selective solder connection point on at least one intermediate carrier, wherein a surface region determined by the local delimitation is smaller than the surface region of the joint surfaces.

9. The method according to claim 8, wherein the soldering is carried out by supplying energy by a laser beam.

* * * * *